CONTROLLED FREQUENCY SWEEP CIRCUITS
Filed March 13, 1963
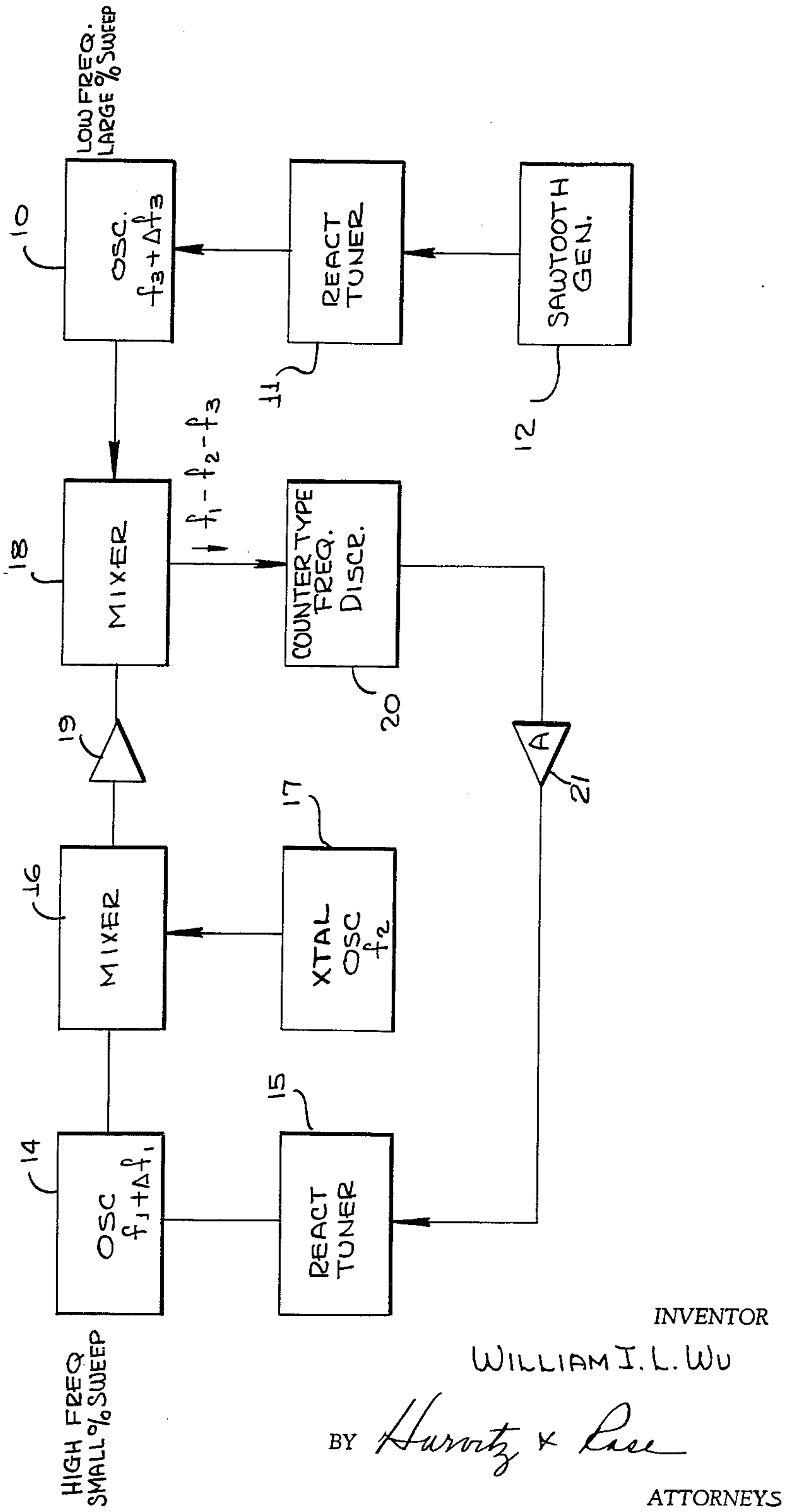
INVENTOR
WILLIAM I. L. WU
BY Hurvitz & Rose
ATTORNEYS

United States Patent Office 3,256,493

Patented June 14, 1966

3,256,493

CONTROLLED FREQUENCY SWEEP CIRCUITS

William I. L. Wu, New Rochelle, N.Y., assignor to The Singer Company, New York, N.Y., a corporation of New Jersey Filed Mar. 13, 1963, Ser. No. 264,849
6 Claims. (Cl. 331—39)

The present invention relates generally to sweeping oscillators, and more particularly to systems for effecting a very accurately controlled frequency sweep, over a very small range, in a very high frequency oscillator.

Oscillators can be swept in frequency by means of voltage or current responsive tuners of diverse types. An example of such a tuner is the reactance tube circuit. Such tuners can not effectively and accurately tune a very high frequency oscillator over a very small tuning range or frequency increment, because the change in frequency is so small a percentage of the mean frequency of the oscillator and because random effects come into play which produce frequency variations commensurate with the desired frequency increments.

In scanning spectrum analyzers, for example, a scanning oscillator is employed, which may have a mean frequency of 50 mc. yet is required to scan linearly perhaps .01 mc. It is difficult to control so small a scan, since the oscillator frequency tends to vary by a commensurate amount due to inherent instability.

According to the present invention, a relatively low frequency oscillator is caused to sweep over a relatively wide band, percentagewise. The total sweep is then relatively small. A high frequency oscillator is then included in a feedback loop with the low frequency oscillator so as to maintain a constant frequency difference therefrom, and thus equality of sweep therewith, on an absolute basis, as well as stability of center frequency of the high frequency oscillator.

It is, accordingly, an object of the invention to provide a novel system of accurately sweeping the frequency of a high frequency oscillator over a narrow band, while maintaining accuracy of mean frequency.

The above and still further objects, features and advantages of the present invention will become apparent upon consideration of the following detailed description of one specific embodiment thereof, especially when taken in conjunction with the accompanying drawings, wherein:

The single figure of the drawings is a block diagram according to the invention.

Referring now to the accompanying drawings, the reference numeral 10 denotes an oscillator, of relatively low frequency, say $f_3$, which is caused to sweep in a preferably sawtooth fashion over a relatively wide band, by means of a reactance tube tuner 11 and a sawtooth voltage generator 12.

Oscillator 14 represents a high frequency oscillator, having a mean frequency $f_1$, for example. The oscillator 14 is tuned by means of a voltage sensitive tuner 15, such as a reactance tube, or in any other fashion appropriate to the oscillator tube employed.

The output of oscillator 14 is frequency converted in a mixer 16, to which is also applied, from crystal oscillator 17, a frequency $f_2$ related to (but not equal to) the difference between the mean frequencies of oscillators 10 and 14. The output of mixer 16 is a frequency equal to that of oscillator 10 plus some fixed amount. This frequency is applied to mixer 18, via amplifier 19. To the mixer 18 is also supplied the output of oscillator 10. The difference frequency output of mixer 18 is supplied to a frequency discriminator 20, in the form of an audio frequency counter, which supplies D.C. AFC voltage to reactance tuner 15, thus closing a feedback loop for control of oscillator 14, to tend to reduce the AFC error voltage to zero. An amplifier 21 may, if desired, be included in the feedback loop to increase the loop sensitivity to error voltage.

If A is the sensitivity of oscillator 14 in cycles per volt, and B the D.C. output voltage sensitivity of audio frequency counter 20 in volts per cycle, and $\Delta f_1$ the change in frequency $f_1$ due to a change $\Delta f_3$ of $f_3$, then $$AB(\Delta f_3-\Delta f_1)=\Delta f_1$$

or $$\Delta f_1=\frac{AB}{1+AB}\Delta f_3$$

If AB is large compared to unity, as it is arranged to be in the present system, $$\Delta f_1\cong\Delta f_3$$

This implies that counter input frequency can always be small, and fairly constant, and the control of $f_1$ by $f_3$ can be as wide or as narrow as desired. By utilizing a narrow band discriminator one can stabilize both narrow and wide sweeps, wherein either $\Delta f_1$ or $\Delta f_3$ is much greater than the change of discriminator input frequency $\Delta f_3-\Delta f_1$.

Typical frequency values employed are $f_1$=50 mc.
$f_2$=48.4 mc.
$f_3$=1.59 mc.

Assuming the mean frequency of oscillator 10 to be $f_3$ and its frequency excursions $\Delta f_3$, the oscillator 14 can be assumed, for example, to have a mean frequency of $f_1$ but to have desired frequency excursion of $\Delta f_1$. The output of oscillator 14 at frequency $f_1+\Delta f_1$ is reduced by heterodyning with the output $f_2$ of oscillator 17. The mixer 18 is then supplied with frequencies $f_1-f_2$ and $f_3$, and thus provides a mean output, applied to discriminator 20, at $f_1-f_2-f_3$, i.e. at 50−48.4−1.59=0.1 mc. for the frequency values assumed, if $\Delta f_1=\Delta f_3$. Since $\Delta f_1\cong\Delta f_3$, as indicated above, the frequency applied to the counter type discriminator 20 remains nearly constant and its output voltage quite steady.

The crystal oscillator 17 introduces no instability into the system. The audio frequency counter discriminator 20, since it is a counter, introduces no appreciable percentage inaccuracy due to drift of its zero response point, as might be the case with a more usual type. The oscillator 14 is essentially locked to the frequency of oscillator 10, for all its values, inclusive of frequency excursions thereof, for a wide range of such excursions. This lock is not on a multiplicative basis, that is, a change in $f_3$ does not simply effect a proportional percentage change in $f_1$, with respect to the mean frequencies $f_3$ and $f_1$, but instead the change in $f_1$ is almost exactly equal to the change in $f_3$, since $\Delta f_1$ is approximately equal to $\Delta f_3$. Thus, for example, if $f_3$ is increased $f_1$ is also increased, by virtue of the AFC error voltage acting through the feedback loop, to maintain constant, or approximately so, the input frequency $f_1-f_2-f_3$ applied to discriminator 20. That is, the sweep of oscillator 14 follows almost exactly the sweep of oscillator 10, because of the tendency to reduce the AFC error voltage always to zero.

While I have described and illustrated one specific embodiment of my invention, it will be clear that variations of the details of construction which are specifically illustrated and described may be resorted to without departing from the true spirit and scope of the invention as defined in the appended claims.

What I claim is:

1. A system for sweeping the frequency of a high frequency oscillator, comprising means for heterodyning the output of said oscillator to a first relatively low frequency, a frequency scanning oscillator operating at a further relatively low frequency, means for heterodyning said first and further relatively low frequencies to obtain a difference frequency, a counter type frequency discriminator responsive to said difference frequency to generate an automatic frequency control voltage, and means responsive to said voltage for controlling the frequency of said high frequency oscillator in such sense as to tend to reduce said voltage to zero.

2. A system for sweeping the frequency of a high frequency oscillator, comprising a further low frequency oscillator, a fixed frequency oscillator having an output frequency near but not equal to the disparity in frequencies of said high and low frequency oscillators, means for sweeping the frequency of said low frequency oscillator, means for heterodyning the frequencies of said oscillators to derive a difference frequency, a counter type frequency discriminator responsive to said difference frequency to develop an automatic frequency control voltage, and means responsive to said voltage for sweeping the frequency of said high frequency oscillator in such sense as to tend always to reduce said voltage to zero.

3. A system for sweeping the frequency of a first oscillator, comprising a second oscillator, means for sweeping the frequency of said second oscillator, said first and second oscillators being widely disparate in frequency, means for converting the frequency of one of said oscillators to a signal having a frequency near but not equal to the frequency of the other of said oscillators, means for heterodyning said near frequencies to derive a difference frequency, a counter type frequency discriminator responsive to said difference frequency, and means responsive to said discriminator for controlling the frequency of said first oscillator in such sense and amount as to tend to generate minimum response of said discriminator.

4. A system for sweeping the frequency of a controlled oscillator, comprising a controlling oscillator, means for sweeping the frequency of said controlling oscillator, said controlled oscillator having a high mean output frequency relative to said controlling oscillator, means for converting the frequency of one of said oscillators to a signal having a frequency near but not equal to the frequency of the other of said oscillators, means for heterodyning said near frequencies to derive a difference frequency, a frequency discriminator responsive to said difference frequency, said discriminator providing an error voltage response when said difference frequency departs from a preselected value, and means responsive to said error voltage for controlling the frequency of said controlled oscillator in such sense and amount as to tend to reduce said error voltage to zero.

5. A system for sweeping the frequency of a high frequency controlled oscillator over a relatively narrow band of frequencies relative to the mean frequency $f_1$ thereof, said system comprising a controlling oscillator having a mean output frequency $f_3$, having a value much smaller than the value of said frequency $f_1$, means for sweeping the output frequency of said controlling oscillator to $f_3+\Delta f_3$, where $\Delta f_3$ is the frequency deviation from $f_3$, a fixed frequency oscillator having an output frequency $f_2$ differing from the frequency difference between $f_1$ and $f_3$ by a fixed value much smaller than the value of $f_3$, means for heterodyning the frequencies of said oscillators to obtain a difference frequency equal to said fixed value, said difference frequency departing from said fixed value by $\Delta f_3$ in response to said frequency deviation $\Delta f_3$ of said controlling oscillator, a frequency discriminator having a sensitivity B defined by its output voltage relative to the frequency applied thereto, said discriminator responsive to said departure of said difference frequency from said fixed value to provide an output voltage representative thereof, means responsive to said output voltage for controlling the frequency of said controlled oscillator in such sense and amount as to return said difference frequency to said fixed value and to minimize said output voltage, said controlled oscillator having a sensitivity A defined by its output frequency relative to input control voltage, said frequency control of said controlled oscillator producing a deviation from $f_1$ by an amount $$\Delta f_1=\frac{AB}{1+AB}\Delta f_3$$

the value of AB being preselected to be much greater than 1 whereby $\Delta f_1 \cong \Delta f_3$, such that a deviation $\Delta f_3$ in said output frequency of said controlling oscillator produces a substantially equal deviation $\Delta f_1$ in said output frequency of said controlled oscillator.

6. A system for varying the frequency of a high frequency oscillator accurately over a range $\Delta f_1$ equal to a relatively small percentage of the value of its mean frequency $f_1$, comprising conversion means including a crystal controlled oscillator for converting the frequency of said high frequency oscillator to a relatively low frequency value, $f_1-f_2$, a low frequency comparison oscillator having a frequency $f_3$ only approximately equal to said low frequency value, means for deriving the difference frequency $f_1-f_2-f_3$, means comprising a counter type frequency discriminator having a D.C. output voltage sensitivity B in volts per cycle responsive to the difference frequency $f_1-f_2-f_3$, means varying the frequency of said comparison oscillator over a band $\Delta f_3$, and means responsive to said discriminator for varying the frequency of said high frequency oscillator over said range $\Delta f_1$ in such sense and amount that $\Delta f_1$ substantially equals $\Delta f_3$, said last means having a sensitivity A in cycles per second per volt such that $$\frac{AB}{1+AB}$$

equals substantially unity.

References Cited by the Examiner

UNITED STATES PATENTS

| | | | |
|---|---|---|---|
| 2,270,023 | 1/1942 | Ramsay et al. | 325—433 |
| 2,526,353 | 10/1950 | Harralson | 331—32 |
| 2,749,442 | 6/1956 | Hansel | 331—38 |

ROY LAKE, *Primary Examiner.*

JOHN KOMINSKI, *Examiner.*

S. H. GRIMM, *Assistant Examiner.*